US00RE40009E

(19) United States
(12) Reissued Patent
Olson et al.

(10) Patent Number: US RE40,009 E
(45) Date of Reissued Patent: Jan. 22, 2008

(54) METHODS AND APPARATUS FOR ADJUSTING BEAM PARALLELISM IN ION IMPLANTERS

(75) Inventors: Joseph C. Olson, Beverly, MA (US); Anthony Renau, West Newbury, MA (US)

(73) Assignee: Varian Semiconductor Equipment Associates, Inc., Gloucester, MA (US)

(21) Appl. No.: 10/922,783

(22) Filed: Aug. 20, 2004

Related U.S. Patent Documents

Reissue of:
(64) Patent No.: 6,437,350
Issued: Aug. 20, 2002
Appl. No.: 09/649,183
Filed: Aug. 28, 2000

(51) Int. Cl.
*H01J 37/08* (2006.01)

(52) U.S. Cl. ..... 250/492.21; 250/492.2; 250/396 R; 250/492.3

(58) Field of Classification Search ..... 250/492.21, 250/492.2, 396 R, 492.3
See application file for complete search history.

(56) References Cited

U.S. PATENT DOCUMENTS

| | | | | |
|---|---|---|---|---|
| 4,021,675 A | | 5/1977 | Shifrin | |
| 4,922,106 A | | 5/1990 | Berrian et al. | |
| 5,126,575 A | * | 6/1992 | White | 250/492.3 |
| 5,180,918 A | * | 1/1993 | Isobe | 250/492.2 |
| 5,350,926 A | | 9/1994 | White et al. | |
| 5,422,490 A | | 6/1995 | Nakamura et al. | |
| 5,641,969 A | | 6/1997 | Cooke et al. | |
| 5,757,018 A | | 5/1998 | Mack et al. | |
| 5,834,786 A | | 11/1998 | White et al. | |
| 6,160,262 A | | 12/2000 | Aoki et al. | |
| 6,163,033 A | | 12/2000 | Smick et al. | |
| 6,255,662 B1 | * | 7/2001 | Rubin et al. | 250/492.21 |
| 6,313,474 B1 | * | 11/2001 | Iwasawa et al. | 250/492.21 |
| 6,566,661 B1 | | 5/2003 | Mitchell | |
| 6,573,518 B1 | | 6/2003 | Renau et al. | |
| 6,791,094 B1 | | 9/2004 | Olson et al. | |

FOREIGN PATENT DOCUMENTS

| | | |
|---|---|---|
| EP | 0 926 699 A1 | 6/1999 |
| EP | 0 975 004 A2 | 1/2000 |
| JP | 03017949 | 1/1991 |
| JP | 20011229873 A | 8/2001 |
| WO | WO 99/13488 A1 | 3/1999 |
| WO | WO 01/04926 A1 | 1/2001 |
| WO | WO 01/27968 A1 | 4/2001 |

OTHER PUBLICATIONS

Olson J.C. et al., "Control of channeling uniformity for advanced applications", 2000 International Conference on Ion Implantation Technology Proceedings. Ion Implantation Technology—2000 (Cat. No. 00EX432), Alpbach, Aus., pp. 670–673, XP002200390, 2000, Piscataway, NJ, IEEE, ISBN:0–7803–6462–7.

International Search Report mailed Mar. 28, 2002 for International Patent Application No. PCT/US01/22392 with an International filing date of Jul. 13, 2001.

* cited by examiner

*Primary Examiner*—Jack I. Berman

(57) ABSTRACT

Methods and apparatus for implanting ions in a workpiece, such as a semiconductor wafer, include generating an ion beam, measuring parallelism of the ion beam, adjusting the ion beam for a desired parallelism based on the measured parallelism, measuring a beam direction of the adjusted ion beam, orienting a workpiece at an implant angle referenced to the measured beam direction and performing an implant with the workpiece oriented at the implant angle referenced to the measured beam direction. The implant may be performed with a high degree of beam parallelism.

60 Claims, 6 Drawing Sheets

METHODS AND APPARATUS FOR ADJUSTING BEAM PARALLELISM IN ION IMPLANTERS

Matter enclosed in heavy brackets [ ] appears in the original patent but forms no part of this reissue specification; matter printed in italics indicates the additions made by reissue.

FIELD OF THE INVENTION

This invention relates to systems and methods for ion implantation of semiconductor wafers or other workpieces and, more particularly, to methods and apparatus for adjusting beam parallelism in ion implanters.

BACKGROUND OF THE INVENTION

Ion implantation is a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. The beam is distributed over the target area by beam scanning, by target movement or by a combination of beam scanning and target movement. An ion implanter which utilizes a combination of beam scanning and target movement is disclosed in U.S. Pat. No. 4,922,106 issued May 1, 1990 to Berrian et al.

The delivery of a parallel ion beam to the semiconductor wafer is an important requirement in many applications. A parallel ion beam is one which has parallel ion trajectories over the surface of the semiconductor wafer. In cases where the ion beam is scanned, the scanned beam is required to maintain parallelism over the wafer surface. The parallel ion beam prevents channeling of incident ions in the crystal structure of the semiconductor wafer or permits uniform channeling in cases where channeling is desired. Typically, a serial ion implanter is utilized when a high degree of beam parallelism is required.

In one approach, the beam is scanned in one dimension so that it appears to diverge from a point, referred to as the scan origin. The scanned beam then is passed through an ion optical element which performs focusing. The ion optical element converts the diverging ion trajectories to parallel ion trajectories for delivery to the semiconductor wafer. Focusing can be performed with an angle corrector magnet or with an electrostatic lens. The angle correction magnet produces both bending and focusing of the scanned ion beam. Parallelism may be achieved with an electrostatic lens, but energy contamination can be a drawback.

The output ion beam from the angle corrector magnet or other focusing element may be parallel or may be converging or diverging, depending on the parameters of the ion beam and the parameters of the focusing element. When an angle corrector magnet is utilized, parallelism can be adjusted by varying the magnetic field of the angle corrector magnet. The angle corrector magnet typically has a single magnetic field adjustment which varies both parallelism and bend angle, or beam direction. It will be understood that the ion implanter is often required to run a variety of different ion species and ion energies. When the beam parameters are changed, readjustment of the angle corrector magnet is required to restore beam parallelism.

In prior art ion implanters, the angle corrector magnet is typically adjusted so that the ion beam has normal incidence on a wafer plane of the ion implanter end station. However, the angle corrector adjustment which achieves normal incidence on the wafer plane may result in less than optimum parallelism. In particular, an ion beam that is adjusted for normal incidence on the wafer plane may be somewhat diverging or converging. As shown in FIG. 8, the angle corrector magnet is adjusted such that the center ray of ion beam 200 is normal to wafer plane 202. However, when the beam 200 is adjusted to be normal to wafer plane 202, the parallelism of beam 200 may be degraded such that the beam converges or diverges. The lack of parallelism is unacceptable in highly critical applications.

In another approach, the angle corrector magnet is designed for best parallelism under typical conditions, and the ion implanter end station is positioned for normal incidence of the ion beam on the wafer. However, beam parallelism and normal incidence are not maintained over a wide range of beam parameters, and changing the position of the end station is very difficult.

Accordingly, there is a need for improved methods and apparatus for adjusting beam parallelism in ion implanters.

SUMMARY OF THE INVENTION

According to a first aspect of the invention, a method is provided for implanting ions into a workpiece. The method comprises the steps of generating an ion beam, adjusting the ion beam for a desired measure of parallelism, measuring a beam direction of the adjusted ion beam, orienting a workpiece at an implant angle referenced to the measured beam direction, and performing an implant with the workpiece oriented at the implant angle.

The step of adjusting the ion beam may comprise adjusting the ion beam for substantially parallel ion trajectories. In general, the beam direction may differ from the beam axis of the ion implanter. The implant angle may be zero degrees, in which case the workpiece is oriented normal to the measured beam direction.

The workpiece may comprise a semiconductor wafer, and the step of orienting the workpiece may comprise tilting the semiconductor wafer at the implant angle referenced to the measured beam direction.

The method may further comprise the step of measuring an angle of non-parallelism of the ion beam. The step of adjusting the ion beam may be based on the measured angle of non-parallelism. The beam direction and the angle of non-parallelism of the ion beam may be measured with a movable beam profiler and one or more beam detectors.

According to another aspect of the invention, apparatus is provided for implanting ions into a workpiece. The apparatus comprises means for generating an ion beam, means for measuring parallelism of the ion beam, means for adjusting the ion beam for a desired parallelism based on the measured parallelism, means for measuring a beam direction of the adjusted ion beam, means for tilting a workpiece at an implant angle referenced to the measured beam direction, and means for performing an implant with the workpiece tilted at the implant angle referenced to the measured beam direction.

According to a further aspect of the invention, apparatus is provided for implanting ions into a workpiece. The apparatus comprises an ion beam generator, an ion optical element for adjusting the ion beam for a desired parallelism, a measuring system for measuring a beam direction of the adjusted ion beam, and a tilt mechanism for tilting a workpiece at an implant angle referenced to the measured beam direction. An implant is performed with the workpiece tilted at the implant angle referenced to the measured beam direction.

The ion optical element may comprise an angle corrector magnet for adjusting the ion beam for substantially parallel ion trajectories. The measuring system may comprise a movable beam profiler and one or more beam detectors. Where the implant angle is zero degrees, the workpiece is tilted normal to the measured beam direction.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
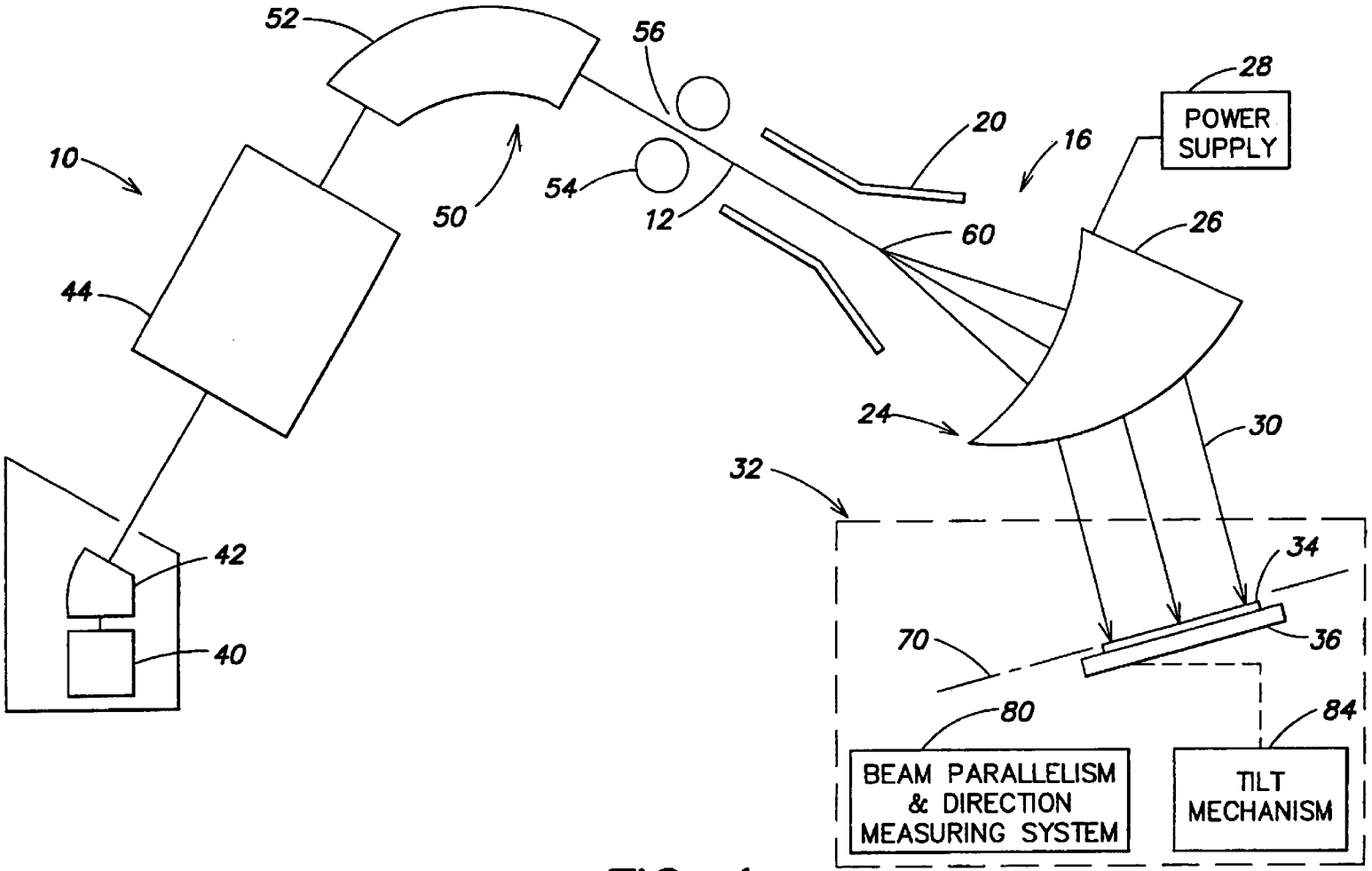
FIG. 1 is a schematic diagram of an ion implanter suitable for implementing the present invention.

A simplified block diagram of an example of an ion implanter suitable for incorporating the present invention is shown in FIG. 1. An ion beam generator 10 generates an ion beam of a desired species, accelerates ions in the ion beam to desired energies, performs mass/energy analysis of the ion beam to remove energy and mass contaminants and supplies an energetic ion beam 12 having low level of energy and mass contaminants. A scanning system 16, which includes a scanner 20 and an angle corrector 24, deflects the ion beam 12 to produce a scanned ion beam 30 having parallel or nearly parallel ion trajectories. An end station 32 includes a platen 36 that supports a semiconductor wafer 34 or other workpiece in the path of scanned ion beam 30 such that ions of the desired species are implanted into the semiconductor wafer 34. The ion implanter may include additional components well known to those skilled in the art. For example, the end station 32 typically includes automated wafer handling equipment for introducing wafers into the ion implanter and for removing wafers after implantation, a dose measuring system, an electron flood gun, etc. It will be understood that the entire path traversed by the ion beam is evacuated during ion implantation.

The principal components of ion beam generator 10 include an ion beam source 40, a source filter 42, an acceleration/deceleration column 44 and a mass analyzer 50. The source filter 42 is preferably positioned in close proximity to ion beam source 40. The acceleration/deceleration column 44 is positioned between source filter 42 and mass analyzer 50. The mass analyzer 50 includes a dipole analyzing magnet 52 and a mask 54 having a resolving aperture 56.

The scanner 20, which may be an electrostatic scanner, deflects ion beam 12 to produce a scanned ion beam having ion trajectories which diverge from a scan origin 60. The scanner 20 may comprise spaced-apart scan plates connected to a scan generator. The scan generator applies a scan voltage waveform, such as a sawtooth waveform, for scanning the ion beam in accordance with the electric field between the scan plates.

Angle corrector 24 is designed to deflect ions in the scanned ion beam to produce scanned ion beam 30 having parallel ion trajectories, thus focusing the scanned ion beam. In particular, angle corrector 24 may comprise magnetic pole pieces 26 which are spaced apart to define a gap and a magnet coil (not shown) which is coupled to a power supply 28. The scanned ion beam passes through the gap between the pole pieces 26 and is deflected in accordance with the magnetic field in the gap. The magnetic field may be adjusted by varying the current through the magnet coil. Beam scanning and beam focusing are performed in a selected plane, such as a horizontal plane.

In the embodiment of FIG. 1, end station 32 includes a beam parallelism and direction measuring system 80. System 80 measures beam parallelism and direction as described below. In addition, end station 32 includes a tilt mechanism 84 for tilting wafer support platen 36 with respect to the scanned ion beam 30. In one embodiment, tilt mechanism 84 may tilt wafer support platen 36 with respect to two orthogonal axes.

Figure 3:
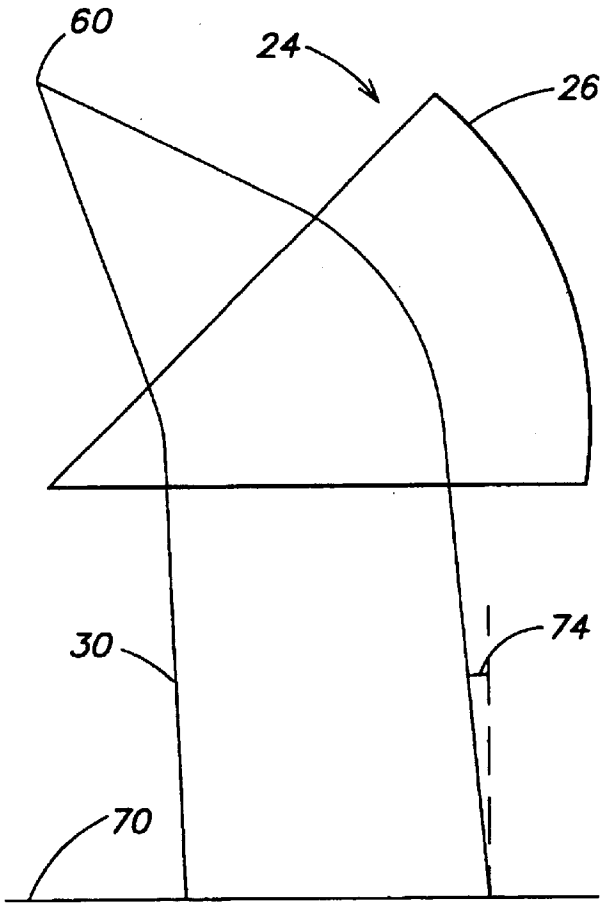
FIG. 3 is a schematic diagram that illustrates the operation of an angle corrector magnet for the case of a relatively small bend angle and diverging ion trajectories.
Figure 2:
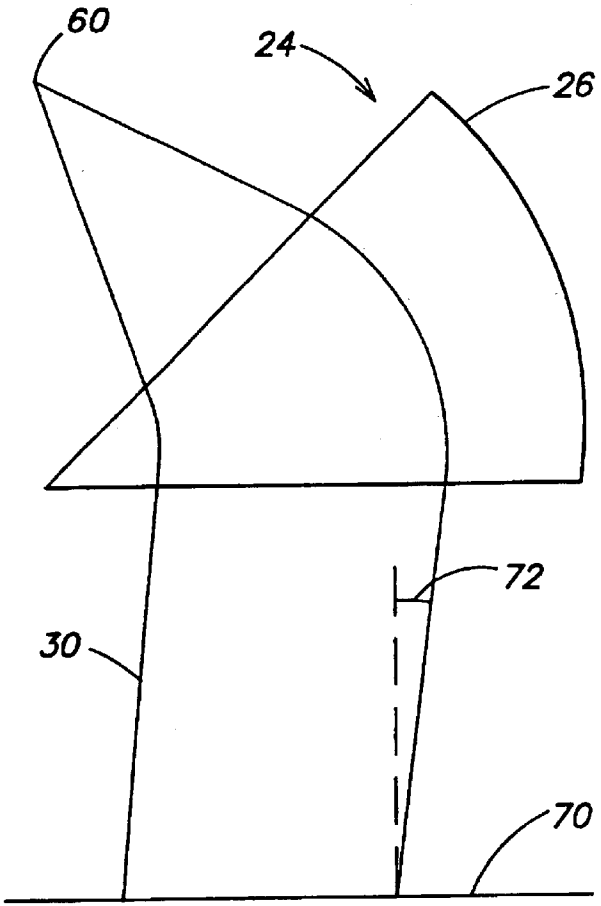
FIG. 2 is a schematic diagram that illustrates the operation of an angle corrector magnet for the case of a relatively large bend angle and converging ion trajectories.

Examples of operation of angle corrector 24 are shown in FIGS. 2 and 3. As shown, the pole pieces 26 of angle corrector 24 may be wedged shaped or similarly shaped so that different ion trajectories have different path lengths through the gap between the pole pieces. In FIG. 2, a relatively high intensity magnetic field is applied. The ion trajectories have a relatively large bend angle and may be converging as they exit from angle corrector 24. In the example of FIG. 3, a relatively low intensity magnetic field is applied. The ion trajectories have a relatively small bend angle and may be diverging as they exit from angle corrector 24. Thus, scanned ion beam 30 is incident on a wafer plane 70 at a positive angle 72 with respect to a normal to wafer plane 70 in the example of FIG. 2 and is incident on wafer plane 70 at a negative angle 74 with respect to a normal to wafer plane 70 in the example of FIG. 3. It will be understood that parallel or nearly parallel ion trajectories can be produced by appropriate adjustment of the magnetic field in angle corrector 24. However in general, the magnetic field that provides the best parallelism does not necessarily result in normal incidence of scanned ion beam 30 on wafer plane 70.

Figure 4:
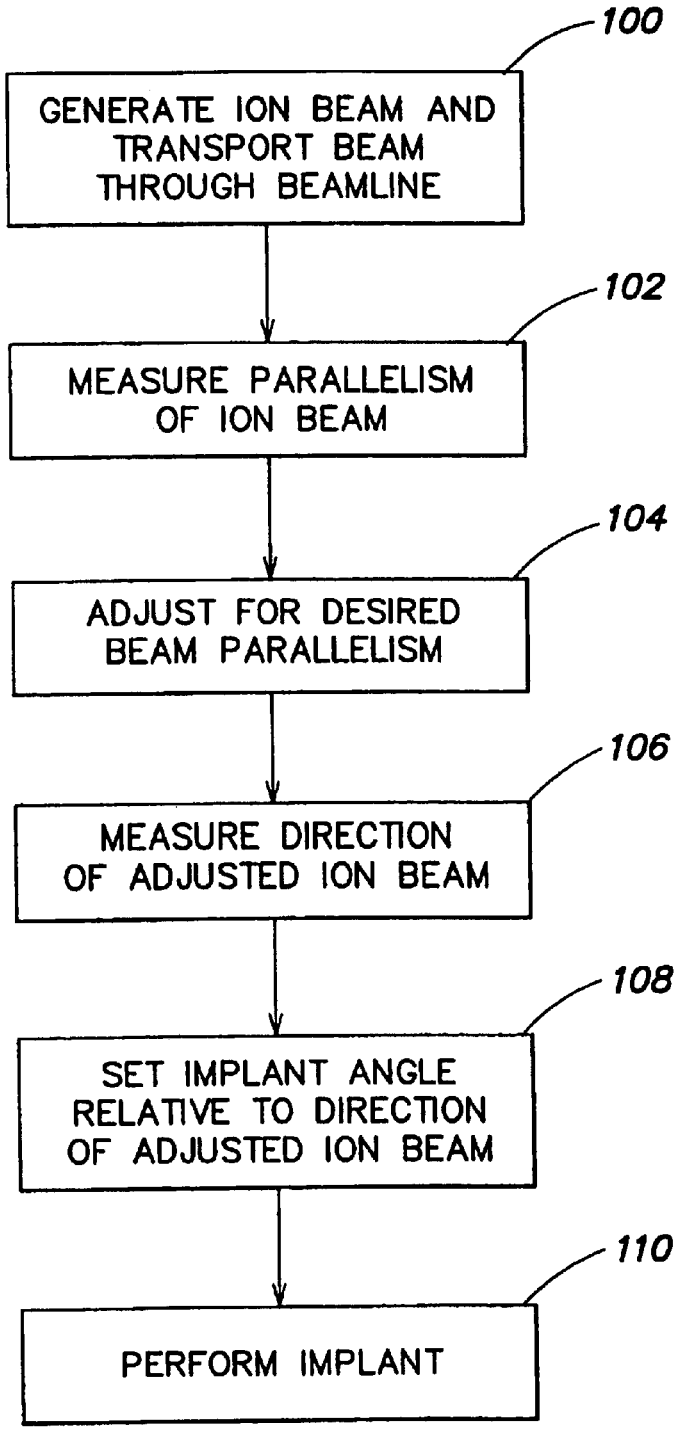
FIG. 4 is a flow chart of a process for adjusting an ion implanter in accordance with an embodiment of the invention.

A flow chart of a process for adjusting an ion implanter and performing ion implantation in accordance with an embodiment of the invention is shown in FIG. 4. In step 100, an ion beam is generated and is transported through the beamline of an ion implanter. As shown in FIG. 1, ion beam 12 is generated by ion beam generator 12 and is transported through scanner 20 and angle corrector 24 to end station 32.

In step 102, the parallelism of the ion beam is measured at or near the plane where the ion beam is incident on the semiconductor wafer or other workpiece. An example of a technique for measuring ion beam parallelism is described below in connection with FIGS. 6A–6C and 7A–7C. The parallelism measurement typically provides an angle of non-parallelism of the ion beam and, in particular, provides a half angle of convergence or divergence of the ion beam. The measured angle of non-parallelism represents the maximum excursion of the ion beam trajectories from the center ray of the ion beam.

Figure 5:
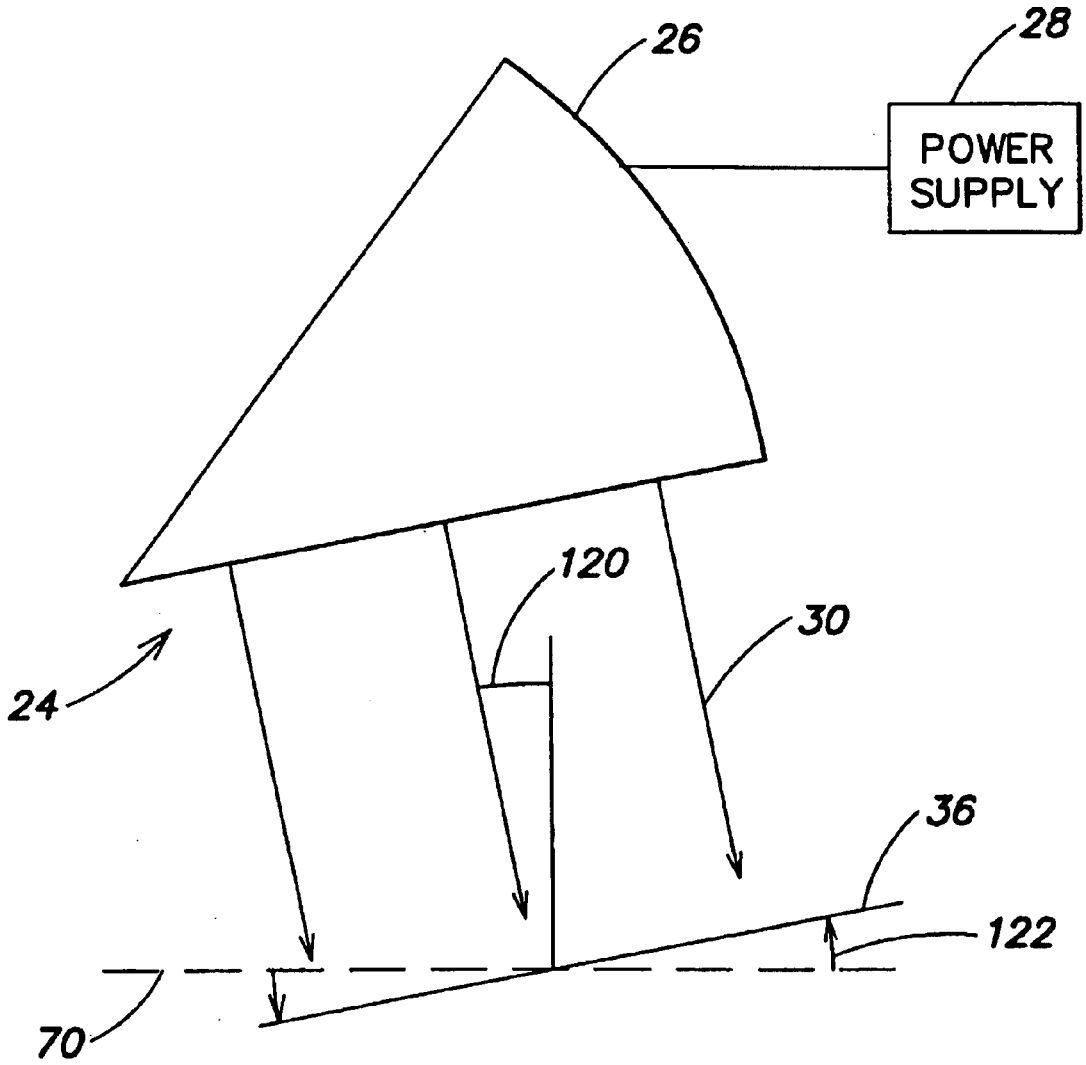
FIG. 5 is a schematic diagram of a parallel ion beam incident on a tilted wafer in accordance with an embodiment of the invention.

In step 104, the ion beam is adjusted for a desired measure of parallelism, typically near zero divergence or convergence. As shown in FIG. 5, the parallelism of the ion beam may be changed by adjusting the current supplied by power supply 28 to the magnet coil. The adjusted current causes a change in the magnetic field of angle corrector 24, which in turn changes the ion trajectories in the ion beam. The adjustment is made by monitoring the measured parallelism of scanned ion beam 30 as power supply 28 is adjusted. When the best parallelism is achieved, the adjustment process of step 104 is terminated. Typically, the ion beam may be adjusted within 0.1° half angle of divergence or convergence.

The magnetic field which provides the best parallelism is, in general, not the same magnetic field which directs scanned ion beam 30 normal to wafer plane 70 of the ion implanter end station. Instead, parallel ion beam 30 is incident on wafer plane 70 at an angle 120 relative to a normal to wafer plane 70, as shown in FIG. 5. It will be understood that the angle 120 is exaggerated in FIG. 5 for purposes of illustration.

In step 106, the direction of the adjusted ion beam is measured. In particular, the angle 120 of the adjusted ion beam relative to the normal to wafer plane 70 is measured. An example of a technique for measuring ion beam direction is described below in connection with FIGS. 6A–6C and 7A–7C. Beam parallelism and beam direction are measured in the plane of scanning and focusing of the ion beam.

In step 108, the implant angle is set relative to the direction of the adjusted ion beam and, in particular, referenced to angle 120. The implant angle is set by tilting wafer support platen 36 relative to the wafer plane 70 of the implanter using tilt mechanism 84. Where normal incidence of the parallel scanned ion beam 30 on the wafer 34 is desired, wafer support platen 36 is tilted by an angle 122 that is equal to angle 120. Thus, the wafer support surface of platen 36 is normal to parallel scanned ion beam 30. Where non-zero implant angles are desired, wafer support platen 36 is tilted relative to the measured beam direction. The measured beam direction is thus the reference for setting the implant angle. The non-zero implant angle may be set by tilting the wafer in a direction parallel to the plane of scanning and focusing or may be set by tilting the wafer in a direction orthogonal to the plane of scanning and focusing. In each case, the non-zero implant angle is referenced to the measured beam direction.

In step 110, the implant is performed with the wafer support platen at the desired implant angle referenced to the measured beam direction and with the scanned ion beam 30 adjusted for best parallelism. Thus, the best parallelism is achieved at the desired implant angle.

Figure 6A:
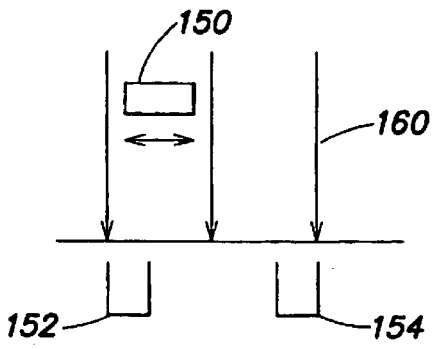
FIGS. 6A–6C are schematic diagrams that illustrate operation of a device for measuring beam parallelism and beam direction.
Figure 7A:
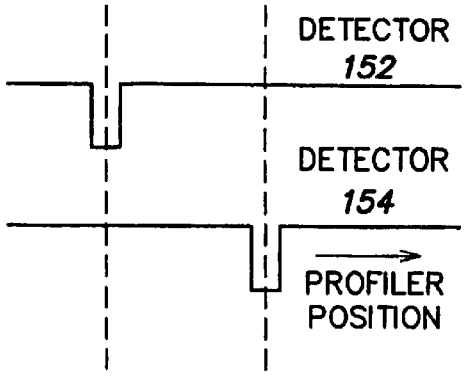
FIGS. 7A–7C are graphs of beam detector output as a function of beam profiler position for the beam conditions illustrated in FIGS. 6A–6C, respectively.
Figure 6B:
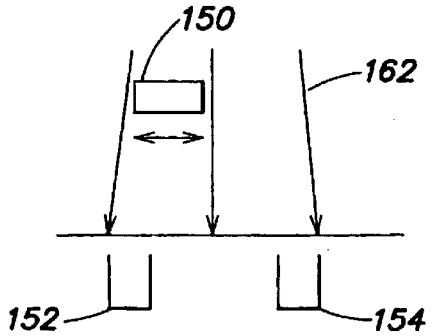
Figure 7B:
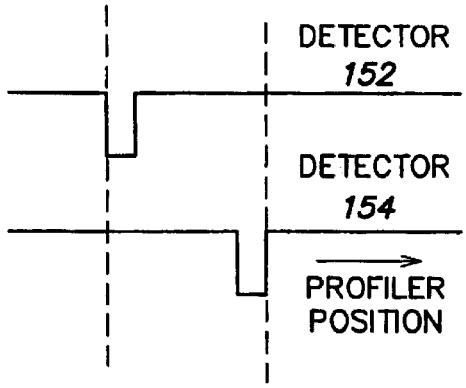
Figure 6C:
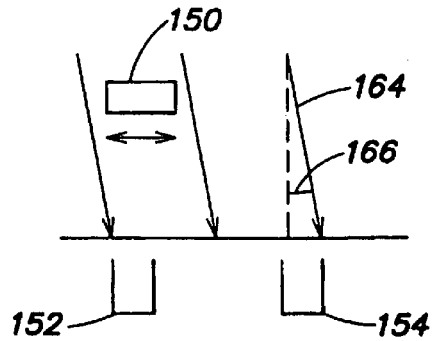
Figure 7C:
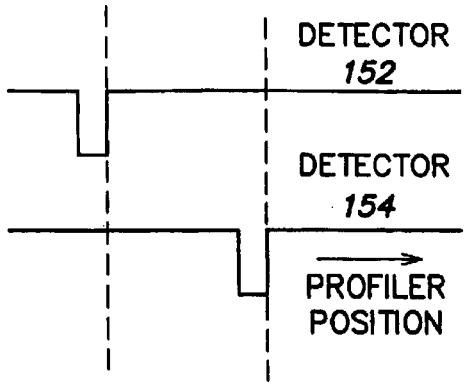
Figure 8:
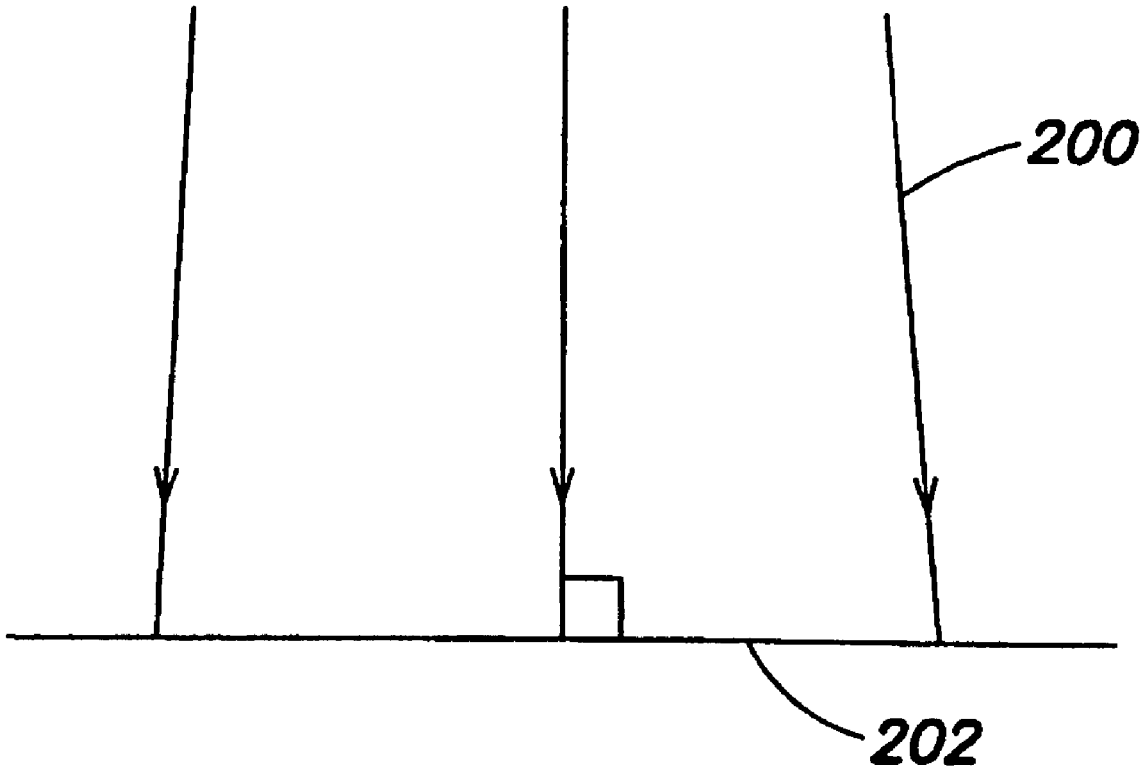
FIG. 8 (PRIOR ART)
FIG. 8 is a schematic diagram that illustrates the prior art method of adjusting beam parallelism.

An example of a technique for measuring ion beam parallelism and direction is described with reference to FIGS. 6A–6C and 7A–7C. FIGS. 6A–6C are schematic diagrams which illustrate the measurement of different ion beams with a beam profiler and two beam detectors. FIGS. 7A–7C are graphs that illustrate the outputs of the beam detectors as a function of profiler position.

As shown in FIGS. 6A–6C, ion beam parallelism and direction are measured using a moving beam profiler 150 and spaced-apart beam detectors 152 and 154, which correspond to beam parallelism and direction measuring system 80 (FIG. 1). Beam profiler 150 may be any element that partially blocks the ion beam and is laterally movable relative to the ion beam. Detectors 152 and 154, for example, may be Faraday cups which produce an electrical output signal in response to an incident ion beam. As the profiler 150 is moved across the ion beam, it blocks a portion of the ion beam and produces an ion beam shadow. The beam shadow moves across detectors 152 and 154 and produces output signals in the form of negative-going output current pulses.

As shown in FIG. 6A, a parallel scanned ion beam 160 has normal incidence on a wafer plane 170. Detectors 152 and 154 produce output pulses as shown in FIG. 7A when the profiler 150 is positioned in alignment with each detector. The profiler positions at which detector output pulses are generated can be used to determine that ion beam 160 has parallel trajectories and is normal to wafer plane 170.

Referring to FIG. 6B, a diverging ion beam 162 has normal incidence on wafer plane 170. In this case, detector 152 produces an output pulse as shown in FIG. 7B when profiler 150 is positioned to the right of detector 152, and detector 154 produces an output pulse when profiler 150 is positioned to the left of detector 154. The profiler positions at which detector output pulses are generated can be used to determine the angle of divergence of ion beam 162. In response to a converging ion beam (not shown), detector 152 produces an output pulse when profiler 150 is positioned to the left of detector 152, and detector 154 produces an output pulse when profiler 150 is positioned to the right of detector 154. The profiler positions at which detector output pulses are generated can be used to determine the angle of convergence of the ion beam.

As shown in FIG. 6C, a parallel ion beam 164 is incident on wafer plane 170 at an angle 166. In this case, detectors 152 and 154 produce output pulses as shown in FIG. 7C when the profiler 150 is positioned to the left of the respective detectors 152 and 154. The profiler positions at which detector output pulses are generated can be used to determine the direction and parallelism of ion beam 164.

In general, the ion beam may be converging or diverging and may have a non-zero beam angle relative to the wafer plane. The profiler positions when detector outputs pulses are generated can be analyzed to determine both the parallelism and direction of the ion beam. The parallelism may be specified as the half angle of divergence or convergence, and the beam direction may be specified relative to a normal to a wafer plane 170. Additional details regarding techniques for measuring ion beam parallelism and direction are provided in U.S. application Ser. No. 09/588,419, filed Jun. 6, 2000, which is hereby incorporated by reference.

It will be understood that different techniques may be used for measuring beam parallelism and direction within the scope of the invention. In addition, the invention is not limited to use with a scanned ion beam. For example, the invention may be used with a ribbon ion beam as disclosed in U.S. Pat. No. 5,350,926, issued Sep. 27, 1994 to White et al.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for implanting ions into a workpiece, comprising the steps of:

generating an ion beam;

adjusting the ion beam for a desired measure of parallelism in a plane;

measuring a beam direction of the adjusted ion beam in said plane *without implanting any workpiece with the ion beam*;

tilting a workpiece about an axis perpendicular to said plane at an implant angle referenced to the measured beam direction; and performing [an] *the* implant with the workpiece tilted at the implant angle.

2. A method as defined in claim 1, wherein the step of adjusting the ion beam comprises adjusting the ion beam for substantially parallel ion trajectories.

3. A method as defined in claim 2, wherein the beam direction differs from a reference direction by a beam angle.

4. A method as defined in claim 1, wherein the step of tilting a workpiece comprises tilting a semiconductor wafer at the implant angle referenced to the measured beam direction.

5. A method as defined in claim 1, wherein the implant angle is zero degrees and the workpiece is tilted normal to the measured beam direction.

6. A method as defined in claim 1, further comprising the step of measuring an angle of non-parallelism of the ion beam, wherein the step of adjusting the ion beam is based on the measured angle of non-parallelism.

7. A method as defined in claim 6, wherein the beam direction and the angle of non-parallelism of the ion beam are measured with a movable beam profiler and one or more beam detectors.

8. A method for implanting ions into a workpiece, comprising the steps of:

generating an ion beam;

measuring parallelism of the ion beam in a plane;

adjusting the ion beam in said plane for a desired parallelism based on the measured parallelism;

measuring a beam direction of the adjusted ion beam in said plane *without implanting any workpiece with the ion beam*;

tilting a workpiece about an axis perpendicular to said plane at an implant angle referenced to the measured beam direction; and performing an implant with the workpiece tilted at the implant angle referenced to the measured beam direction.

9. A method as defined in claim 8, wherein the step of adjusting the ion beam comprises adjusting the ion beam for substantially parallel ion trajectories.

10. A method as defined in claim 8, wherein the implant angle is zero degrees and the workpiece is tilted normal to the measured beam direction.

11. A method as defined in claim 8, wherein the step of measuring parallelism of the ion beam comprises the step of measuring an angle of non-parallelism of the ion beam and wherein the step of adjusting the ion beam is based on the measured angle of non-parallelism.

12. A method as defined in claim 11 wherein the angle of non-parallelism and the beam direction are measured with a movable beam profiler and one or more beam detectors.

13. A method as defined in claim 8 wherein the step of tilting a workpiece comprises tilting a semiconductor wafer.

14. Apparatus for implanting ions into a workpiece, comprising:

means for generating an ion beam;

means for measuring parallelism of the ion beam in a plane;

means for adjusting the ion beam in said plane for a desired parallelism based on the measured parallelism;

means for measuring a beam direction of the adjusted ion beam in said plane *without implanting any workpiece with the ion beam*;

means for tilting a workpiece about an axis perpendicular to said plane at an implant angle referenced to the measured beam direction; and means for performing an implant with the workpiece tilted at the implant angle referenced to the measured beam direction.

15. Apparatus as defined in claim 14, wherein said means for adjusting the ion beam comprises means for adjusting the ion beam for substantially parallel trajectories.

16. Apparatus as defined in claim 14, wherein the implant angle is zero degrees and the workpiece is tilted normal to the measured beam direction.

17. Apparatus as defined in claim 14, wherein said means for measuring parallelism and said means for measuring the beam direction comprises a movable beam profiler and one or more beam detectors.

18. Apparatus as defined in claim 14, wherein said means for tilting the workpiece comprises a tilt mechanism for tilting a semiconductor wafer relative to the ion beam.

19. Apparatus for implanting ions into a workpiece, comprising:

an ion beam generator;

an ion optical element for adjusting the ion beam for a desired parallelism in a plane;

a measuring system for measuring a beam direction of the adjusted ion beam in said plane *without implanting any workpiece with the ion beam*; and a tilt mechanism for tilting the workpiece about an axis perpendicular to said plane at an implant angle referenced to the measured beam direction, wherein an implant is performed with the workpiece tilted at the implant angle referenced to the measured beam direction.

20. Apparatus as defined in claim 19, wherein said ion optical element comprises an angle corrector magnet for adjusting the ion beam for substantially parallel ion trajectories.

21. Apparatus as defined in claim 18, wherein said measuring system comprises a movable beam profiler and one or more beam detectors.

22. Apparatus as defined in claim 18, wherein said tilt mechanism is configured for tilting a semiconductor wafer.

23. A method as defined in claim 1, further comprising the step of scanning the ion beam in said plane.

24. A method as defined in claim 8, further comprising the step of scanning the ion beam in said plane.

25. Apparatus as defined in claim 14, further comprising means for scanning the ion beam in said plane.

26. Apparatus as defined in claim 19, further comprising a scanner for scanning the ion beam in said plane.

*27. A method for implanting ions into a workpiece, comprising:*

*generating an ion beam;*

*measuring a beam direction of the ion beam without implanting any workpiece with the ion beam;*

*tilting a workpiece about an axis that is not parallel to the measured beam direction at an implant angle referenced to the measured beam direction; and*

*performing an implant with the workpiece tilted at the implant angle.*

*28. A method as defined in claim 27, wherein tilting the workpiece comprises tilting a semiconductor wafer.*

*29. A method as defined in claim 27, wherein tilting the workpiece comprises tilting a semiconductor wafer about an axis that is substantially perpendicular to the measured beam direction.*

*30. A method as defined in claim 27, further comprising scanning the ion beam.*

*31. A method as defined in claim 27, wherein generating an ion beam comprises generating a ribbon ion beam.*

*32. A method as defined in claim 27, further comprising adjusting the ion beam for a desired parallelism.*

*33. Apparatus for implanting ions into a workpiece, comprising:*

*means for generating an ion beam;*

*means for measuring a beam direction of the ion beam without implanting any workpiece with the ion beam;*

*means for tilting a workpiece about an axis that is not parallel to the measured beam direction at an implant angle referenced to the measured beam direction, wherein the implant is performed with the workpiece tilted at the implant angle.*

*34. Apparatus as defined in claim 33, wherein said means for tilting the workpiece comprises a tilt mechanism for tilting a semiconductor wafer relative to the ion beam.*

*35. Apparatus as defined in claim 33, where said means for tilting the workpiece comprises a tilt mechanism for tilting a semiconductor wafer about an axis that is substantially perpendicular to the measured beam direction.*

*36. Apparatus as defined in claim 33, further comprising means for scanning the ion beam.*

*37. Apparatus as defined in claim 33, wherein said means for generating comprises means for generating a ribbon ion beam.*

*38. Apparatus as defined in claim 33, further comprising means for adjusting the ion beam for a desired parallelism.*

*39. Apparatus for implanting ions into a workpiece, comprising:*

*an ion beam generator;*

*a measuring system for measuring a beam direction of the ion beam without implanting any workpiece with the ion beam; and*

*a tilt mechanism for tilting the workpiece about an axis that is not parallel to the measured beam direction at an implant angle referenced to the measured beam direction, wherein the implant is performed with the workpiece tilted at the implant angle.*

*40. Apparatus as defined in claim 39, wherein said tilt mechanism is configured for tilting a semiconductor wafer.*

*41. Apparatus as defined in claim 39, wherein said tilt mechanism is configured to tilt a semiconductor wafer about an axis that is substantially perpendicular to the measured beam direction.*

*42. Apparatus as defined in claim 39, further comprising a scanner for scanning the ion beam.*

*43. Apparatus as defined in claim 39, where said ion beam generator is configured to generate a ribbon ion beam.*

*44. Apparatus as defined in claim 39, further comprising an ion optical element for adjusting the ion beam for a desired parallelism.*

*45. A method for implanting ions into a workpiece, comprising the steps of:*

*generating an ion beam;*

*adjusting the ion beam for a desired measure of parallelism;*

*measuring a beam direction of the adjusted ion beam without implanting any workpiece with the ion beam;*

*tilting a workpiece about an axis that is not parallel to the measured beam direction at an implant angle referenced to the measured beam direction; and*

*performing the implant with the workpiece titled at the implant angle.*

*46. A method as defined in claim 45, wherein the step of adjusting the ion beam comprises adjusting the ion beam for substantially parallel ion trajectories.*

*47. A method as defined in claim 45, wherein tilting the workpiece comprises tilting a semiconductor wafer.*

*48. A method as defined in claim 45, wherein tilting the workpiece comprises tilting a semiconductor wafer about an axis that is substantially perpendicular to the measured beam direction.*

*49. A method for implanting ions into a workpiece, comprising the steps of:*

*generating an ion beam;*

*measuring parallelism of the ion beam;*

*adjusting the ion beam for a desired parallelism based on the measured parallelism;*

*measuring a beam direction of the adjusted ion beam without implanting any workpiece with the ion beam;*

*tilting a workpiece about an axis that is not parallel to the measured beam direction at an implant angle referenced to the measured beam direction; and*

*performing the implant with the workpiece tilted at the implant angle referenced to the measured beam direction.*

*50. A method as defined in claim 49, wherein the step of adjusting the ion beam comprises adjusting the ion beam for substantially parallel ion trajectories.*

*51. A method as defined in claim 49, wherein tilting the workpiece comprises tilting a semiconductor wafer.*

*52. A method as defined in claim 49, wherein tilting the workpiece comprises tilting a semiconductor wafer about an axis that is substantially perpendicular to the measured beam direction.*

*53. Apparatus for implanting ions into a workpiece, comprising:*

*means for generating an ion beam;*

*means for measuring parallelism of the ion beam;*

*means for adjusting the ion beam for a desired parallelism based on the measured parallelism;*

*means for measuring a beam direction of the adjusted ion beam without implanting any workpiece with the ion beam;*

*means for tilting a workpiece about an axis that is not parallel to the measured beam direction at an implant angle referenced to the measured beam direction; and*

*means for performing the implant with the workpiece tilted at the implant angle referenced to the measured beam direction.*

*54. Apparatus as defined in claim 53, wherein said means for adjusting the ion beam comprises means for adjusting the ion beam for substantially parallel ion trajectories.*

*55. Apparatus as defined in claim 53, wherein said means for tilting the workpiece comprises a tilt mechanism for tilting a semiconductor wafer relative to the ion beam.*

*56. Apparatus as defined in claim 53, wherein said means for tilting the workpiece comprises a tilt mechanism for tilting a semiconductor wafer about an axis that is substantially perpendicular to the measured beam direction.*

*57. Apparatus for implanting ions into a workpiece, comprising:*

*an ion beam generator;*

*an ion optical element for adjusting the ion beam for a desired parallelism;*

*a measuring system for measuring a beam direction of the adjusted ion beam without implanting any workpiece with the ion beam; and*

*a tilt mechanism for tilting the workpiece about an axis that is not parallel to the measured beam direction at an implant angle referenced to the measured beam direction, wherein the implant is performed with the workpiece tilted at the implant angle referenced to the measured beam direction.*

*58. Apparatus as define in claim 57, wherein said ion optical element comprises an angle corrector magnet for adjusting the ion beam for substantially parallel ion trajectories.*

*59. Apparatus as define in claim 57, wherein said tilt mechanism is configured for tilting a semiconductor wafer.*

*60. Apparatus as define in claim 57, wherein said tilt mechanism is configured to tilt a semiconductor wafer about an axis that is substantially perpendicular to the measured beam direction.*

* * * * *